(12) United States Patent
Baumgartner

(10) Patent No.: US 6,822,376 B2
(45) Date of Patent: Nov. 23, 2004

(54) METHOD FOR MAKING ELECTRICAL CONNECTION TO ULTRASONIC TRANSDUCER

(75) Inventor: Charles E. Baumgartner, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/065,792

(22) Filed: Nov. 19, 2002

(65) Prior Publication Data

US 2004/0095045 A1 May 20, 2004

(51) Int. Cl.⁷ .............................................. H01L 41/08
(52) U.S. Cl. ...................................... 310/365; 310/334
(58) Field of Search ................................ 310/327, 322, 310/334, 332, 365, 366, 311; H01L 41/08

(56) References Cited

U.S. PATENT DOCUMENTS

| | | | | |
|---|---|---|---|---|
| 4,078,160 A | * | 3/1978 | Bost | ........................... 381/190 |
| 6,051,913 A | * | 4/2000 | King | ........................... 310/327 |

FOREIGN PATENT DOCUMENTS

| | | | | |
|---|---|---|---|---|
| ES | 2024763 | * | 3/1990 | ........... H04R/31/00 |

\* cited by examiner

Primary Examiner—Thomas M. Dougherty
Assistant Examiner—Karen Addison
(74) Attorney, Agent, or Firm—Ostrager Chong Flaherty & Broitman P.C.

(57) ABSTRACT

A method of making an electrical connection between a pair of electrically conductive surfaces, comprising the steps of: placing an electrically conductive (e.g., metal) mesh and a mass of adhesive material between a pair of mutually opposing electrically conductive surfaces; pressing the electrically conductive surfaces together with the mesh and adhesive material therebetween with sufficient pressure that the mesh contacts the opposing electrically conductive surfaces; and curing the adhesive material while pressing the electrically conductive surfaces together. In an ultrasonic transducer, electrically conductive mesh can be placed between a metallized rear surface of a piezoelectric ceramic layer and a printed circuit on a dielectric substrate. Alternatively, the mesh can be placed between opposing metallized surfaces of a piezoelectric ceramic layer and an acoustic backing layer, with electrical conductors being passed through the acoustic backing-layer for connection to a printed circuit.

24 Claims, 5 Drawing Sheets

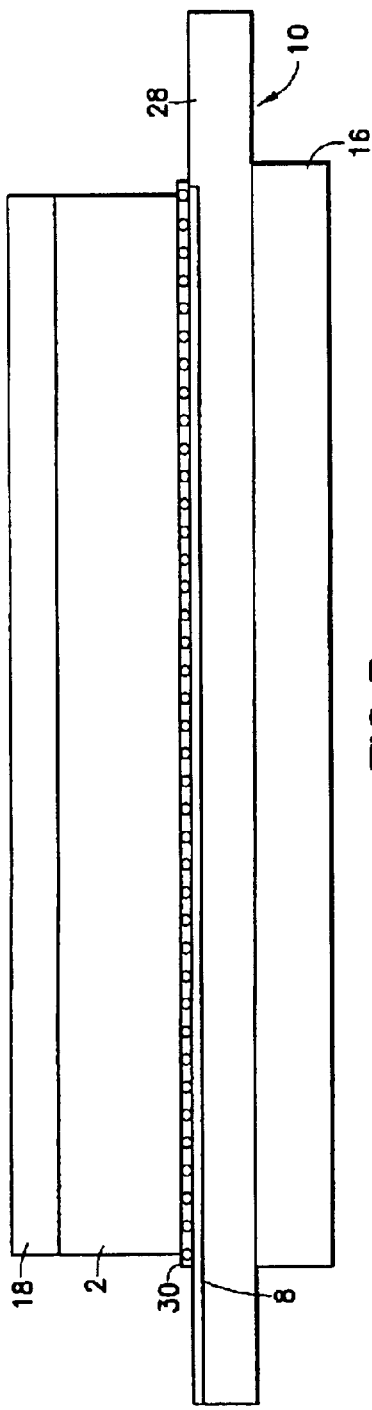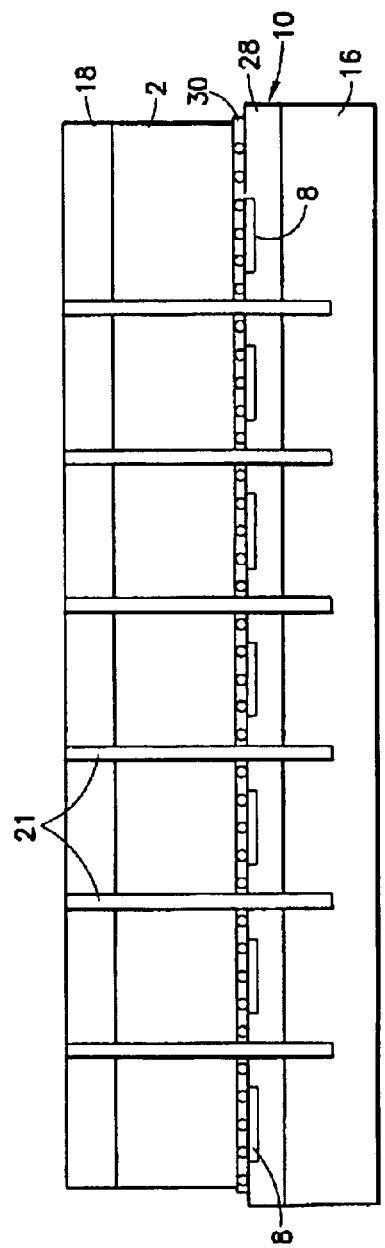

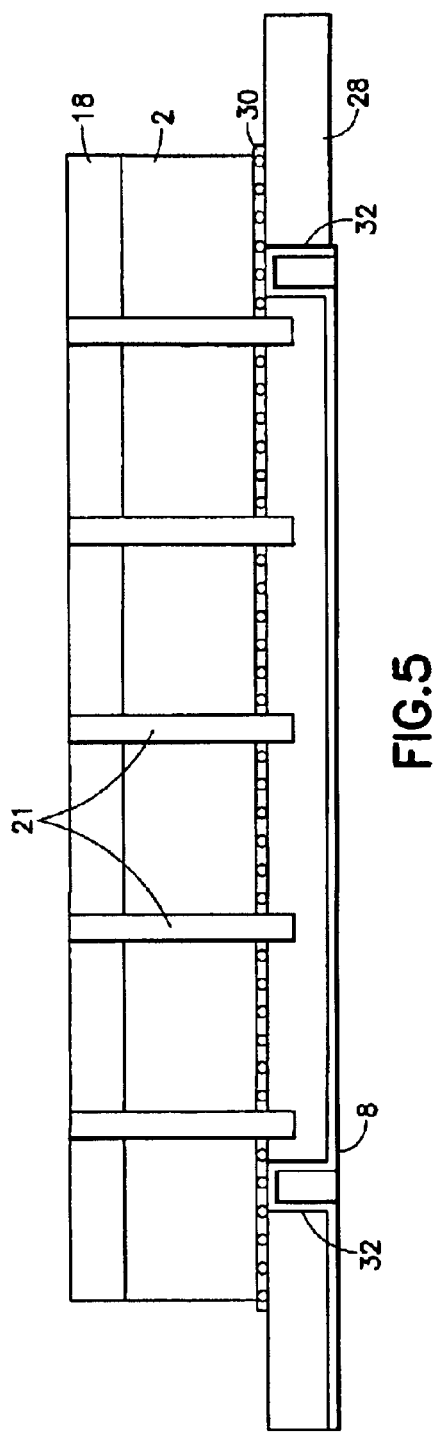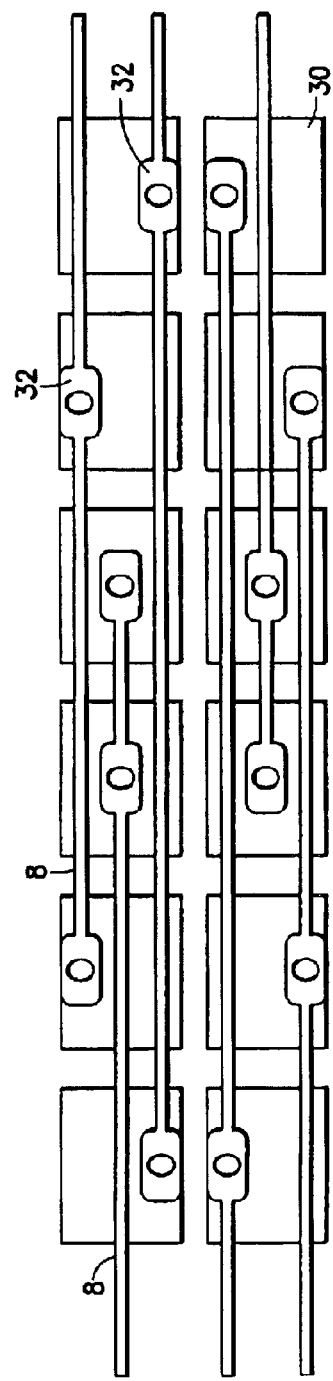

METHOD FOR MAKING ELECTRICAL CONNECTION TO ULTRASONIC TRANSDUCER

BACKGROUND OF INVENTION

This invention generally relates to methods and devices for making electrical connections between two electrically conductive elements, specifically to electrical connections between electrically conductive elements in acoustic transducers.

Electrical connections to the piezoelectric ceramic in ultrasound transducers must meet requirements of low electrical resistivity and high bond strength while not impacting the acoustic performance. The piezoelectric ceramic in ultrasound transducers is often bonded to a flexible printed circuit board (hereinafter "flex circuit") or other electrical connector using an epoxy bond. This bond joint needs to be electrically conductive for the applied voltage to be converted to mechanical energy by the piezoelectric material. However, bonding epoxy in an unfilled state is an electrical insulator. Therefore an epoxy bond that prevents intimate contact between the ceramic and flex circuit will result in poor electrical contact. Epoxy formulations possessing conductive fillers are known to provide electrical conduction between electrically conductive surfaces, however these materials possess filler particles in a sufficiently high concentration as to cause acoustic reflection in thin layers when placed within the acoustic path of an ultrasound transducer.

Many ultrasonic transducers are phased arrays comprising single or multiple rows of electrically and mechanically independent transducer elements. In these types of transducers, each transducer element may be a layered structure comprising an acoustic absorber, a piezoelectric ceramic layer, one or more acoustic matching layers, and a front wear plate or focusing lens. Typically, one or more flex circuits are used to make electrical connections (signal and ground) from the piezoelectric ceramic layer to the signal processing electronics, or to a bundle of coaxial cables that ultimately connect to the signal processing electronics.

To obtain a bond with sufficiently low electrical resistivity for ultrasound transducers, a high pressure is commonly applied to the bond interface prior to and during curing of the epoxy. If the flex circuit and piezoelectric ceramic surfaces are microscopically rough and the epoxy layer is sufficiently thin, then an electrical connection is achieved via a distribution of direct contacts between high points on the piezoelectric ceramic surface and high points on the flex circuit. Under sufficient pressure, metallized asperities on the ceramic penetrate through the epoxy bond to make direct contact with the flex circuit. Thin epoxy bonds can provide low electrical resistivity and acceptable acoustic properties, however the bond strength is reduced for such thin bonds. In accordance with this technique, the actual contact-area through the epoxy layer, and hence the electrical conductivity, varies with the ceramic surface texture and relative degree of parallelism of the two materials. Epoxy bond joints are known to be relatively weakened when applied in very thin layers. Commercial epoxy suppliers often recommend a minimum bond thickness of 10 microns or greater. The high-pressure bonding process needed for electrical reasons results in an epoxy bond that is by necessity thinner than desired. Therefore, for optimum adhesion it is desired to have a thicker flex circuit-to-ceramic bond while for optimum electrical contact and acoustic performance the bond should be thin. These two requirements are directly opposed to one another.

The above-described aspects complicate the ultrasound transducer manufacturing process. The ceramic and flex circuit surfaces need to be flat and parallel, and bonding pressures need to be high to prevent formation of a thick, and hence not electrically conducting, epoxy bond. There is a need for a simpler manufacturing technique that satisfies the dual requirements of optimum adhesion and optimum electrical contact.

SUMMARY OF INVENTION

The present invention is directed to a method of making an electrical connection between an ultrasonic transducer element or array of elements and a conductive trace of a printed circuit (including inflexible as well as flexible printed circuits). The invention is also directed to the resulting assembly.

One aspect of the invention is an assembly comprising: a layer made of ultrasound transducing material; an electrically conductive coating on a surface of the layer of ultrasound transducing material; a substrate made of dielectric material; an electrical conductor formed on a surface of the substrate, the substrate being disposed so that the electrical conductor confronts the electrically conductive coating on the layer of ultrasound transducing material; an electrically conductive mesh disposed so that a portion intervenes between and is in contact with the electrical conductor on the substrate and the electrically conductive coating on the layer of ultrasound transducing material; and adhesive material occupying interstices in the mesh and in contact with the electrically conductive coating and the electrical conductor: For example, the mesh may comprise an electroformed metal mesh or a metal-plated polymeric mesh.

Another aspect of the invention is an ultrasound transducer comprising: a body of piezoelectric ceramic material, the body comprising front and rear surfaces; an electrode formed on the rear surface of the body of piezoelectric ceramic material; a substrate made of dielectric material; a pad of electrically conductive material formed on a surface of the substrate, the substrate being disposed so that the pad confronts the electrode; an electrically conductive mesh disposed so that a portion intervenes between and is in contact with the pad and the electrode; and adhesive material occupying spaces in the mesh and in contact with the pad and the electrode.

A further aspect of the invention is an ultrasound transducer comprising: an array of ultrasound transducer elements, each of the ultrasound transducer elements comprising a respective body of piezoelectric ceramic material and a respective electrode formed on a surface of the respective body, the bodies being substantially acoustically isolated from each other, and the electrodes being substantially electrically isolated from each other; and a printed circuit comprising an array of pads of electrically conductive material, each pad confronting a respective one of the electrodes, the pads being substantially electrically isolated from each other. The printed circuit is bonded to the array of transducer elements by adhesive material disposed between the confronting electrodes and pads. The transducer further comprises a multiplicity of sections of an electrically conductive mesh embedded in the adhesive material, each one of the mesh sections being sandwiched between a respective one of the electrodes and a respective one of the pads. Each mesh section is separated from adjacent mesh sections by a respective gap.

Yet another aspect of the invention is a method of making an electrical connection between a pair of electrically conductive surfaces, comprising the steps of: placing an electrically conductive mesh and a mass of adhesive material between a pair of mutually opposing electrically conductive surfaces; pressing the electrically conductive surfaces together with the mesh and adhesive material therebetween with sufficient pressure that the mesh contacts the electrically conductive surfaces; and curing the adhesive material while maintaining the electrically conductive surfaces in a pressed state.

Another aspect of the invention is a method of assembling an ultrasound transducer, comprising the following steps: (a) metallizing a surface of a layer of piezoelectric ceramic material; (b) metallizing a surface of an dielectric substrate in accordance with a pattern; (c) arranging the piezoelectric ceramic layer, the dielectric substrate, an electrically conductive mesh and a mass of adhesive material-so that the metallized surface of the piezoelectric ceramic layer and the metallized surface of the dielectric substrate confront each other, and the mesh and the adhesive material are disposed between the confronting electrically conductive surfaces; (d) pressing the piezoelectric ceramic layer and the dielectric substrate together with the mesh and adhesive material therebetween with sufficient pressure that the mesh contacts the electrically conductive surfaces; and curing the adhesive material while maintaining the piezoelectric ceramic layer and the dielectric substrate in a pressed state.

A more robust bonding process is obtained by placing a thin electrically conductive mesh at the bond area. Such a mesh improves electrical conductivity at lower bonding pressures and can compensate for non-parallel bond surfaces while the thicker epoxy bond joint formed within the mesh openings increases the bond strength. Metal meshes only a few microns thick and having low metal density are sufficiently close to being acoustically transparent that they do not affect transducer performance. The electrically conductive mesh is placed in the bond area to provide electrical connection between the metallized ceramic and flex circuit substrates. Because of the openings in the mesh, a thicker, hence stronger, epoxy bond is formed.

Other aspects of the invention are disclosed and claimed below.

BRIEF DESCRIPTION OF DRAWINGS

FIGS. 3 and 4 are drawings showing end and side views respectively of a row of ultrasonic transducer elements electrically connected to a flex circuit via metal mesh in accordance with one embodiment of the present invention.

FIG. 5 is a drawing showing an end view of a multi-row ultrasonic transducer electrically connected to a multi-layer flex circuit via metal mesh in accordance with another embodiment of the present invention.

FIG. 6 is a drawing showing the positions of electrically conductive traces, vias and pads on a multilayer flex circuit relative to the metal mesh sections and overlying piezoelectric ceramic elements of the array depicted in FIG. 5. The mesh structure has not been drawn in detail to avoid complicating the drawing.

DETAILED DESCRIPTION

Figure 1:
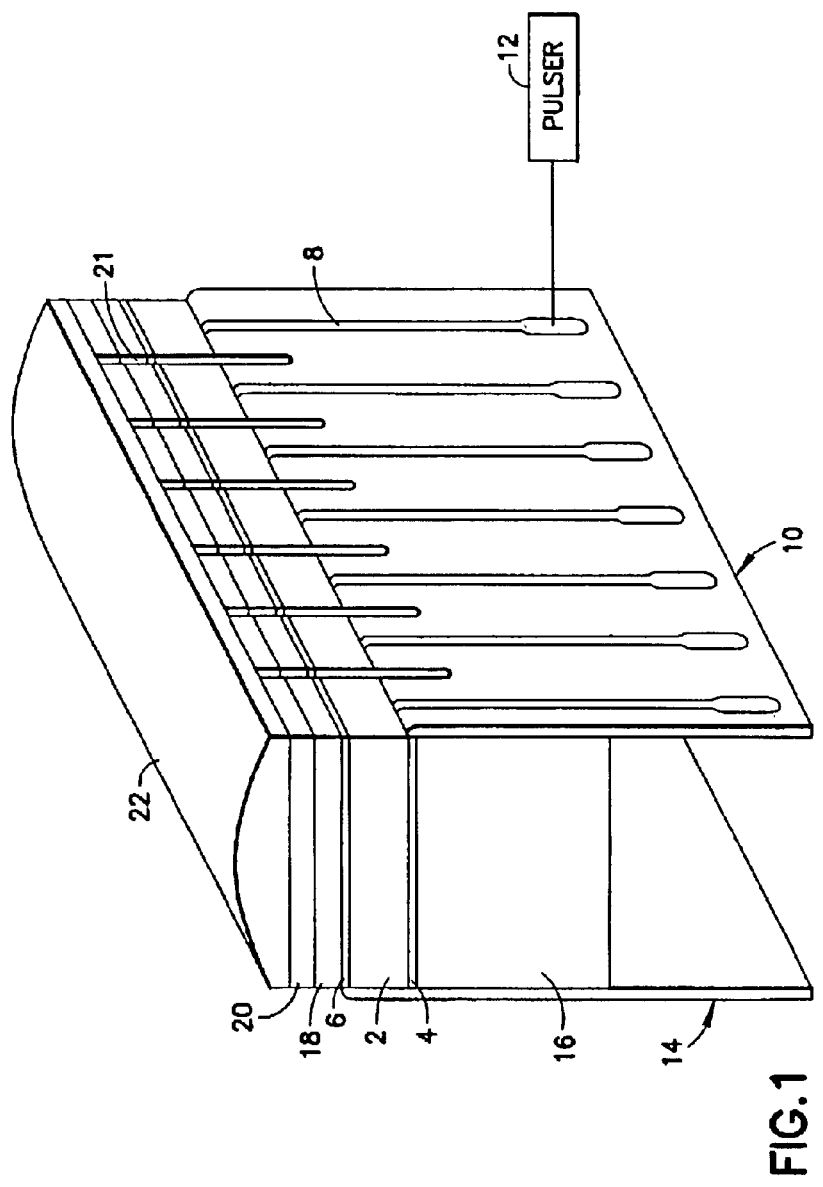
FIG. 1 is a drawing showing an isometric view of an ultrasound transducer pallet of a known type.

As shown in FIG. 1, a conventional transducer pallet comprises a linear array of narrow transducer elements. Each transducer element comprises a layer 2 of piezoelectric ceramic material. The piezoelectric material is typically lead zirconate titanate (PZT), polyvinylidene difluoride, or PZT ceramic/polymer composite. Typically, the piezoelectric ceramic material 2 of each transducer element has a signal electrode 4 formed on its rear face and a ground electrode 6 formed on its forward face. Each signal electrode 4 can be connected to a signal source, e.g., a respective pulser 12 in the transmitter (not shown) of the ultrasound imaging system which the probe is connected to, via a respective conductive trace 8 on a signal flex circuit 10. The amplitude, timing and transmit sequence of the transmit pulses applied by the pulsers are determined by various control means incorporated in the system transmitter. Each ground electrode 6 is connected to a common ground (not shown) via a respective trace (not shown) on a ground flex circuit 14. Often the signal and ground electrodes are connected to the respective flex circuits at the same side of the pallet (they are shown in FIG. 1 on opposite sides for illustration only). The transducer pallet also comprises a mass 16 of suitable acoustical damping material having high acoustic losses, e.g., a mixture of epoxy, silicone rubber and tungsten particles, positioned at the back surface of the transducer element array. This backing layer 16 is coupled to the rear surface of the transducer elements to absorb ultrasonic waves that emerge from the back side of each element, so that they will not be partially reflected and interfere with the ultrasonic waves propagating in the forward direction. Typically, each transducer array element also comprises a first acoustic impedance matching layer 18, which is bonded to the metallized forward face (which metallization forms the ground electrode) of the piezoelectric ceramic layer 2, as seen in FIG. 1. A second acoustic impedance matching layer 20 is bonded to the first acoustic impedance matching layer 18. Layers 2, 18 and 20 in the transducer pallet are bonded using acoustically transparent thin layers of adhesive. The acoustic impedance of the second matching layer 20 must be less than the acoustic impedance of the first matching layer 18 and greater than the acoustic impedance of the medium acoustically coupled to the transducer array.

FIG. 1 shows a pallet that has been diced into separate transducer elements, each element comprising layers 2, 4, 6, 18 and 20 laminated together to form a stack. It will be readily appreciated, however, that the undiced pallet is constructed by laminating layers or strata to form a stack. The pallet is then diced to a sufficient depth to form the respective transducer elements. A dicing saw is used to form parallel element isolation cuts or kerfs 21. Each cut passes completely through the acoustic matching layers 18, 20 and the piezoceramic layer 2, and extends only partially into the acoustic absorbing layer 16. The kerf 21 may be left empty or may be filled with a material that has a low shear modulus. After dicing, the front faces of the second acoustic impedance matching layers 20 of the transducer elements are conventionally bonded to the planar rear face of a convex cylindrical lens 22 (e.g., made of silicone rubber) using an acoustically transparent thin layer of silicone adhesive.

Typically, one or more flex circuits are used to make electrical connections (signal and ground) from the piezoceramic to signal processing electronics, or to a bundle of coaxial cables which ultimately connect to the signal processing electronics. One method of connecting the flex circuit(s) to the piezoceramic elements is illustrated in FIG.

Figure 2:
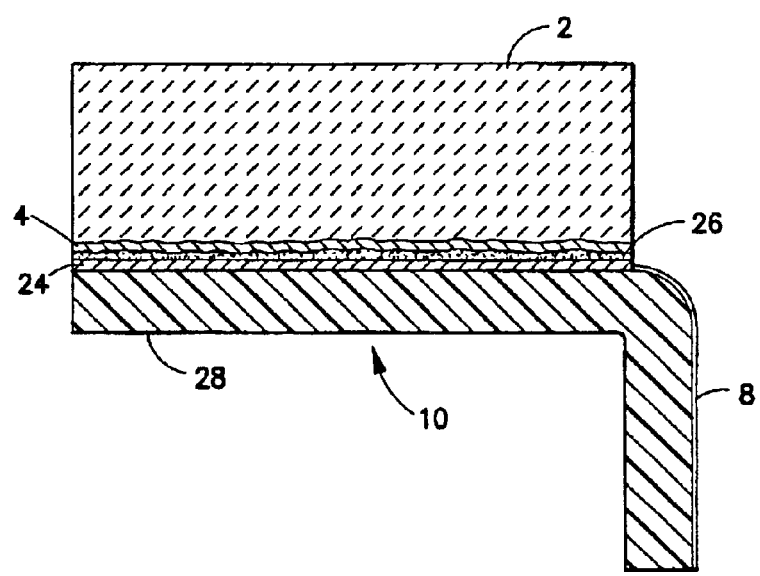
FIG. 2 is a drawing showing one method of connecting a flex circuit to signal electrodes on a piezoelectric ceramic layer in an ultrasound transducer through a non-conductive epoxy layer.

2. In FIG. 2, a signal electrode 4 and electrical connection to the signal flex circuit are on the bottom surface of the ceramic layer 2. In particular, the signal electrode 4 is electrically coupled to a layer of metal 24 deposited on the dielectric-substrate 28 of the signal flex circuit 10. Although not shown in FIG. 2, it will be readily appreciated that the metal deposit 24 may be formed on the surface of the signal flex circuit 10 while the conductive traces 8 of the latter may lie at a different level in the flex circuit substrate and may be electrically coupled to the metal deposit 24 via throughholes (not shown in FIG. 2) formed in the dielectric substrate 28. FIG. 2 shows an ohmic contact between the signal flex circuit 10 and the signal electrode 4 through a non-conductive epoxy layer 26. The non-conductive epoxy is represented in FIG. 2 by the white spaces between electrode 4 and metal deposit 24. A similar arrangement would be applied to the connection of the ground electrodes to the ground flex circuit.

In accordance with one method, the metal deposit 24 forms exposed metal pads on the dielectric substrate 28 of the flex circuit 10. The exposed metal pads are laminated, using high pressure and a thin layer of non-conductive epoxy 26, to the electrode 4 formed on the surface of the piezoceramic layer 2 if the flex circuit and ceramic surfaces are microscopically rough and the epoxy layer is sufficiently thin, then an electrical connection is achieved via a distribution of direct contacts between high points on the ceramic and high points on the flex circuit. The quality of such an ohmic electrical connection is very sensitive to material and process parameters that can be difficult to control (surface roughness, flatness, and parallelism; epoxy viscosity; lamination pressure).

FIGS. 3 and 4 show a row of ultrasonic transducer elements 2 electrically connected to a flex circuit 10 via metal or metallized mesh 30 in accordance with one embodiment of the present invention. The signal electrode on the rear face of each ultrasonic transducer element 2 is electrically connected to a corresponding conductive trace 8 printed on a dielectric substrate 28 (made, e.g., of Kapton® polyimide) via a respective section of mesh 30 that is embedded in a layer of adhesive (not shown). The metal or metallized mesh is an open framework of strands that form spaces. For example, the mesh can be a grid with square open spaces. The mesh may be of a woven construction, as a screen, but it is preferable to have a planar structure. The interconnected or interlaced strands that form the framework with openings may be made of metal or a polymeric material plated with metal. The metal or metallized mesh is in contact with both of the opposing electrically conductive surfaces, acting as an electrical bridge, while the adhesive fills the open spaces and joins the flex circuit to the transducer array. A respective acoustic impedance matching layer 18 can be joined to the front face of each transducer element, with a ground connection disposed therebetween. The resulting array is laminated to an acoustic backing layer One method for manufacturing and assembling the ultrasound transducer shown in FIGS. 3 and 4 comprises the following steps. A layer of piezoelectric ceramic material is made having mutually parallel planar front and rear surfaces. Both surfaces are then metallized by any conventional means, such as vacuum deposition, electroless plating, evaporation or solution coating. A layer of suitable acoustic impedance matching material is then laminated to the front surface of the piezoelectric ceramic layer. Also, a circuit is printed on a flexible dielectric substrate, made, e.g., of polyimide. As part of this processing step, metal is deposited on a surface of the dielectric substrate to form a pattern of conductive traces with or without conductive pads.

Thereafter, a layer of adhesive material is applied on the rear surface of the piezoelectric ceramic layer and an electroformed metal mesh is pressed against the adhesive-covered surface. Then the side of the dielectric substrate having the conductive traces or pads printed thereon is pressed against the rear surface of the piezoelectric ceramic layer with the metal or metallized mesh and adhesive therebetween. The piezoelectric ceramic layer and dielectric substrate are pressed together with sufficient pressure that the mesh contacts both the metallized surface of the former and the conductive traces or pads of the latter. Then a temperature is maintained sufficient to cure the adhesive material while holding the piezoelectric ceramic layer and the dielectric substrate in the pressed state.

After the adhesive has cured, an acoustic backing layer is laminated to the back of the resulting laminate, i.e., on the side of the dielectric substrate opposite to the piezoelectric ceramic layer. The resulting assembly is then diced to the depth indicated by kerfs 21 in FIG. 4, thereby forming separate acoustically and electrically isolated laminated elements supported by the undiced portion of the acoustic backing layer. Each laminated element comprises an acoustic impedance matching layer 18, a piezoelectric ceramic transducer element 2, a section of metal or metallized mesh 30 embedded in adhesive, and a segment of a flex circuit 10. Each flex circuit segment has an individual conductive trace 8 that is electrically connected to the signal electrode of a respective transducer element 2 via the intervening mesh section 30.

A similar method can be used to manufacture an ultrasonic transducer having multiple rows of transducer elements, with the difference that another dicing operation must be performed in order to form the respective rows, the cuts of the additional dicing operation being orthogonal to the cuts made in the first dicing operation (described above). Preferably, the dicing operation that forms the rows is performed before an acoustic impedance matching layer (or layers) is laminated to the piezoelectric ceramic layer, while the dicing operation that forms the columns (i.e., that forms the individual transducer elements in each row) is performed after the acoustic impedance matching layer (or layers) has been laminated to the piezoelectric ceramic layer. In accordance with this method, the first acoustic impedance matching layer may be metallized on one side to form a ground connection that is diced when the columns are formed, thereby forming ground connection segments. These segments are connected by a bus printed on a portion of the dielectric substrate that extends beyond the transducer array. During a third dicing operation, the acoustic impedance matching layer (or layers) is diced in alignment with the kerfs formed during the first dicing operation that formed the rows, but only to a depth that falls short of the ground connection.

A multi-row ultrasonic transducer in accordance with one embodiment of the invention is partially depicted in FIGS. 5 and 6. Before dicing, the pallet comprises a layer of piezoelectric ceramic material 2 laminated to a layer of acoustic impedance matching material 18. The rear face of the layer of piezoelectric ceramic is metallized. A flex circuit comprising a dielectric substrate 28 with conductive traces 8 printed on one side thereof is bonded to the rear of the piezoelectric ceramic layer with a metal or metallized mesh 30 sandwiched therebetween. The adhesive layer between the piezoelectric ceramic layer and the flex circuit, which fills the open spaces in the mesh 30, is not shown. The flex circuit further comprises metallized vias 32 in the dielectric substrate 28, which are electrically connected to the conductive traces 8 and which extend through the dielectric substrate 28 to contact the metal mesh on the other side of the substrate. The flex circuit is bonded under sufficient pressure that, when the adhesive is cured, the metal mesh will be in electrical contact with both the metallized rear face of the piezoelectric ceramic layer and the exposed ends (with or without pads) of the metallized vias 32. Although not shown, the person skilled in the art will appreciate that an acoustic backing layer (not shown in FIG. 5) will be laminated to the pallet in a manner that the dielectric substrate 28 will be acoustically coupled to the acoustic backing layer.

After the foregoing strata have been laminated to form a pallet, the pallet is diced in mutually orthogonal directions to form a multiplicity of rows, each row comprising a multiplicity of elements forming columns. FIG. 5 shows the kerfs 21 formed by the dicing operation that divides the piezoelectric ceramic layer into rows. FIG. 6 shows one representative kerf formed by dicing the pallet orthogonal to kerfs 21. As seen in FIG. 5, the pallet is diced to a depth below the mesh 30, but above the conductive traces 8 on the back side of the flex circuit. Thus the mesh 30 is divided into a multiplicity of rectangular sections (as depicted in FIG. 6 without structural detail) corresponding to the rectangular transducer elements. Each transducer element in turn comprises a layer of piezoelectric ceramic material and a layer of acoustic impedance matching material. Each section of mesh 30 electrically connects the metallized rear face of a respective transducer element to a respective metallized via 32.

The multi-row array depicted in FIG. 6 is suitable for use as a so-called "1.5D" transducer array. In a 1.5D array, elevation aperture, shading and focusing are dynamically variable, but symmetric about the centerline of the array. In this example, the array has six rows and the centerline lies between the third and fourth rows. The six transducer elements in each column are paired as follows: the elements in the third and fourth rows are electrically connected in tandem to a first electrical conductor of the flex circuit; the elements in the second and fifth rows are electrically connected in tandem to a second electrical conductor of the flex circuit; and the elements in the first and sixth rows are electrically connected in tandem to a third electrical conductor of the flex circuit. As a result, the third and fourth transducer elements in a particular column will always be driven concurrently by a pulser. Likewise the second and fifth transducer elements in a particular column will always be driven concurrently, and so forth. Although FIG. 6 shows only two columns, it should be appreciated that the typical 1.5D array might have 128, 256, 512, 1024 or more columns, i.e., transducer elements in each row.

Figure 7:
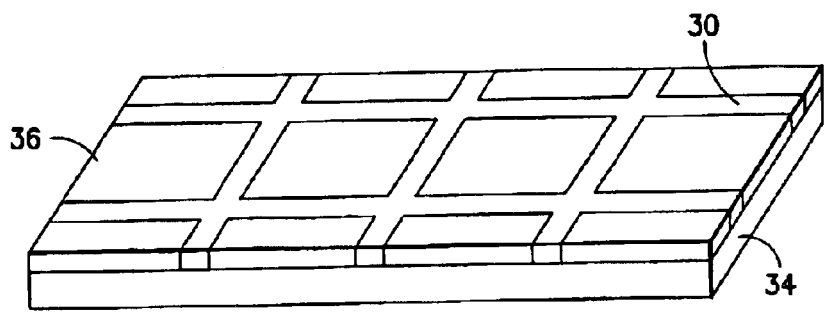
FIG. 7 is a drawing showing an isometric view of an electroformed metal mesh not yet removed from a mandrel.

Metal mesh suitable for practicing the present invention can be prepared by electroforming with a variety of metal lines/inch and with a total thickness of 10 microns or less. In accordance with one electroforming technique, a metal mandrel is used as a substrate to hold a design image on which the metal mesh will be formed. Prior to electroforming, the mandrel is cleaned to remove all contaminants. Then the mandrel substrate is coated with a light-sensitive liquid and allowed to dry. The prepared mandrel is placed behind the artwork and contacted under vacuum. The design image of the mesh is then exposed onto the photosensitive coating using ultraviolet lamps, thereby hardening the resist and setting a bond to the metal substrate. Areas blocked by the design image are not bonded to the metal. Non-bonded photo-resist is then selectively washed away, leaving clean metal areas ready for electro-deposition. The bonded photo-resist remains to act as a barrier, keeping metal from collecting outside of the selected areas during the plating process. The mandrel is then immersed in plating solution and attached to the negative side of a rectifier, making the mandrel a cathode. An electrode of the desired metal is immersed in the solution and attached to the positive side of the same DC power supply, forming the anode. Referring to FIG. 7, when the power is turned on, the metal is deposited onto the exposed portions of the mandrel 34, i.e., the grid lines between the bonded photo-resist 36, forming a metal mesh 30. This metal mesh is then removed from the mandrel.

An electrically conductive bond between the flex circuit and the metallized ceramic that is more robust to the pressure bonding process is obtained by incorporating a thin metal mesh into the bond area. A preferred metal mesh for this application may be as thick as 10 microns, but preferably is 3–7 microns thick, and possesses a metal content by area of less than 25% (i.e., an open area of 75% or greater). A metal mesh such as this will be acoustically transparent when bonded between the piezoelectric ceramic and flex circuit and therefore not adversely affect the performance of the ultrasound transducer. The presence of the metal increases the robustness of the lamination process by reducing the need for asperities on the ceramic to contact the flex circuit. At the same time the openings in the metal mesh allow for a thicker epoxy bond area leading to an increased bond strength. The adhesion strength between the metal-coated ceramic and flex circuit is a function of several parameters, one of which is the epoxy bond thickness. Adhesion of ceramic samples bonded to copper-coated polyimide film was measured using both-peel and shear methods. All samples were bonded under 400 psi pressure to ensure a low-electrical-resistivity bond. The peel adhesion was measured using a 90-degree peel test by peeling a Kapton® polyimide from the ceramic surface at a rate of 2 inches/minute. The samples prepared without the mesh incorporated into the bond area possessed an average adhesion of 3.4 pli (pounds/inch) peel and a standard deviation of 0.3 pli. However, the adhesion for the samples prepared with the electroformed mesh possessed a 40% greater average adhesion at 4.8 pli and a lower standard deviation of 0.2 pli. Similarly the adhesion was measured using single lap shear testing, in which ceramic was bonded to one lap shear support and copper bonded to polyimide was bonded to the other support. The average shear adhesion was 698 psi with a standard deviation of 107 psi. However, when an electroformed mesh was added to the bond area, the average lap shear adhesion more than doubled to 1525 psi, while the standard deviation decreased to 76 psi. Both of these tests confirm that a stronger bond is formed when the epoxy thickness is increased by adding the metal mesh to the bond.

In addition to strength of the epoxy bond, the bond must also be electrically conductive. Experiments designed to evaluate the electrical robustness of the bonding process versus the parameters of lamination bond pressure and flex bond pad contact area were carried out. Gold-plated ceramic pressure bonded against a flex circuit bond pad possessing an area of 0.01 square millimeters. Bond pads of this size are common for ultrasound transducers. A six sigma lower limit on electrical resistivity across the bond is 1 ohm. Tests made without any metal mesh included in the lamination process possessed average electrical resistivity values vs. lamination pressure of 62.7 ohms for 50 psi pressure, 5.8 ohms for 150 psi pressure, 3.8 ohms, for 250 psi pressure, and 0.7 ohm for 400 psi pressure. Therefore, a lamination bonding pressure of 400 psi would be required to yield an acceptable metallized ceramic-to-flex bond. However, if a 7-micron-thick piece of electrformed Ni possessing 200 lines/inch (12-micron-wide Ni line) is placed into the bond area along with the epoxy, the following electrical resistivity is obtained as a function of lamination bond pressure: 8.1 ohms for 50 psi pressure, 0.9 ohm for 150 psi pressure, 0.5 ohm for 250 psi pressure, and 0.2 ohm for 400 psi pressure. Therefore the lamination pressure can be as low as only 150 psi and still yield an acceptable part.

Although the foregoing measurements were made for epoxy bonds, other suitable adhesives, such as polyurethane and silicone, can be used.

The use of metal mesh provides increased robustness for the manufacturing process by enabling an acceptable electrical resistivity to be obtained at a lower lamination bond pressure while simultaneously providing an increase in bond strength and an acoustically transparent bond. The use of metal mesh also increases the process window for manufacturing (i.e., lamination pressure, parallelism of parts, etc.).

While the invention has been described with reference to preferred embodiments, it will be understood by those skilled in the art that various changes may-be made and equivalents may be substituted for elements thereof without departing from the scope or the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

As use in the claims, the term "mesh" means an open framework of strands that form spaces. The strands of the mesh can be integrally connected to each other, as is true when the mesh is electroformed, or they can be woven, i.e., interlaced.

What is claimed is:

1. An assembly comprising:
   a layer made of ultrasound transducing material;
   an electrically conductive coating on a surface of said layer of ultrasound transducing material;
   a substrate made of dielectric material that is not ultrasound transducing material;
   an electrical conductor formed on a surface of said substrate, said substrate being disposed so that said electrical conductor confronts said electrically conductive coating on said layer of ultrasound transducing material;
   an electrically conductive mesh disposed so that a portion intervenes between and is in contact with said electrical conductor on said substrate and said electrically conductive coating on said layer of ultrasound transducing material; and
   adhesive material occupying interstices in said mesh and in contact with said electrically conductive coating and said electrical conductor.

2. The assembly as recited in claim 1, wherein said adhesive material comprises epoxy resin, polyurethane, silicone, cyanoacrylate or functionally equivalent adhesive.

3. The assembly as recited in claim 1, wherein said mesh comprises strands of metal.

4. The assembly as recited in claim 1, wherein said mesh comprises strands of polymer plated with metal.

5. The assembly as recited in claim 1, wherein said ultrasound transducing material comprises piezoelectric ceramic.

6. The assembly as recited in claim 1, wherein said dielectric material comprises a polymer.

7. The assembly as recited in claim 1, wherein said mesh has a total thickness of 10 microns or less.

8. The assembly as recited in claim 1, wherein said mesh comprises electrodeposited material.

9. An ultrasound transducer comprising:
   a body of piezoelectric ceramic material, said body comprising front and rear surfaces;
   an electrode formed on said rear surface of said body of piezoelectric ceramic material;
   a substrate made of dielectric material;
   a pad of electrically conductive material formed on a surface of said substrate, said substrate being disposed so that said pad confronts said electrode;
   an electrically conductive mesh disposed so that a portion intervenes between and is in contact with said pad and said electrode; and
   adhesive material occupying spaces in said mesh and in contact with said pad and said electrode.

10. The ultrasound transducer as recited in claim 9, wherein said adhesive material comprises epoxy resin, polyurethane, silicone, cyanoacrylate or functionally equivalent adhesive.

11. The ultrasound transducer as recited in claim 9, wherein said mesh comprises strands of metal.

12. The ultrasound transducer as recited in claim 9, wherein said mesh comprises strands of polymer plated with metal.

13. The ultrasound transducer as recited in claim 9, wherein said dielectric material comprises a polymeric film.

14. The ultrasound transducer as recited in claim 9, wherein said mesh has a total thickness of microns or less.

15. The ultrasound transducer as recited in claim 9, wherein said mesh comprises electrodeposited material.

16. The ultrasound transducer as recited in claim 9, further comprising an acoustic matching layer disposed in front of said front surface of said body of piezoelectric ceramic material.

17. The ultrasound transducer as recited in claim 9, further comprising an acoustic backing layer disposed behind said dielectric substrate.

18. An ultrasound transducer comprising:
   an array of ultrasound transducer elements, each of said ultrasound transducer elements comprising a respective body of piezoelectric ceramic material and a respective electrode formed on a surface of said respective body, said bodies being substantially acoustically isolated from each other, and said electrodes being substantially electrically isolated from each other; and
   a printed circuit comprising an array of pads of electrically conductive material, each pad confronting a respective one of said electrodes, said pads being substantially electrically isolated from each other,
   wherein said printed circuit is bonded to said array of transducer elements by adhesive material disposed between said confronting electrodes and pads, further comprising a multiplicity of sections of an electrically conductive mesh embedded in said adhesive material, each one of said mesh sections being sandwiched between a respective one of said electrodes and a respective one of said pads, each of said mesh sections being separated from adjacent mesh sections by a respective gap.

19. The ultrasound transducer as recited in claim 18, wherein said printed circuit further comprises an array of electrically conductive traces, each of said traces being electrically connected to a respective one of said pads.

20. The ultrasound transducer as recited in claim 19, wherein said printed circuit further comprises a flexible dielectric substrate that supports said pads and said traces.

21. The ultrasound transducer as recited in claim 20, further comprising an acoustic backing layer, wherein said flexible dielectric substrate is sandwiched between said array of ultrasound transducer elements and said acoustic backing layer.

22. The ultrasound transducer as recited in claim 18, wherein said adhesive material comprises epoxy resin, polyurethane, silicone, cyanoacrylate or functionally equivalent adhesive.

23. The ultrasound transducer as recited in claim 18, wherein said mesh has a total thickness of 10 microns or less.

24. The ultrasound transducer as recited in claim 18, wherein said mesh is electroformed.

* * * * *